United States Patent
Kang et al.

(10) Patent No.: US 9,892,779 B2
(45) Date of Patent: Feb. 13, 2018

(54) MEMORY DEVICE PERFORMING HAMMER REFRESH OPERATION AND MEMORY SYSTEM INCLUDING THE SAME

(71) Applicant: Samsung Electronics Co., Ltd., Suwon-si (KR)

(72) Inventors: Kyu-Chang Kang, Hwaseong-si (KR); Hui-Kap Yang, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/331,970

(22) Filed: Oct. 24, 2016

(65) Prior Publication Data

US 2017/0213586 A1    Jul. 27, 2017

(30) Foreign Application Priority Data

Jan. 25, 2016   (KR) .................. 10-2016-0008442

(51) Int. Cl.

| | | |
|---|---|---|
| G11C 7/00 | (2006.01) | |
| G11C 11/406 | (2006.01) | |
| G06F 3/06 | (2006.01) | |
| G11C 11/4076 | (2006.01) | |
| G11C 11/408 | (2006.01) | |
| G11C 11/4091 | (2006.01) | |

(52) U.S. Cl.
CPC ...... *G11C 11/40618* (2013.01); *G06F 3/0619* (2013.01); *G06F 3/0659* (2013.01); *G06F 3/0673* (2013.01); *G11C 11/4076* (2013.01); *G11C 11/4085* (2013.01); *G11C 11/4087* (2013.01); *G11C 11/4091* (2013.01); *G11C 11/40603* (2013.01)

(58) Field of Classification Search
CPC .......... G11C 11/40618; G11C 11/4076; G11C 11/4087; G11C 11/4091
USPC ......................................... 365/222
See application file for complete search history.

(56) References Cited

U.S. PATENT DOCUMENTS

| 6,078,543 | A | 6/2000 | Kim |
|---|---|---|---|
| 8,693,269 | B2 | 4/2014 | Kang et al. |
| 2014/0156923 | A1 | 6/2014 | Bains et al. |
| 2014/0281206 | A1 | 9/2014 | Crawford et al. |
| 2015/0043294 | A1 | 2/2015 | Yang |

(Continued)

FOREIGN PATENT DOCUMENTS

| KR | 10-2015-0026227 A | 3/2015 |
|---|---|---|
| WO | WO 2015/030751 A1 | 3/2015 |

*Primary Examiner* — Huan Hoang
(74) *Attorney, Agent, or Firm* — Muir Patent Law, PLLC

(57) ABSTRACT

A memory device includes a memory bank, a row selection circuit and a refresh controller. The memory bank includes a plurality of memory blocks, and each memory block includes a plurality of memory cells arranged in rows and columns. The row selection circuit performs an access operation with respect to the memory bank and a hammer refresh operation with respect to a row that is physically adjacent to a row that is accessed intensively. The refresh controller controls the row selection circuit such that the hammer refresh operation is performed during a row active time for the access operation. The hammer refresh operation may be performed efficiently and performance of the memory device may be enhanced by performing the hammer refresh operation during the row active time for the access operation.

17 Claims, 11 Drawing Sheets

(56) References Cited

U.S. PATENT DOCUMENTS

| | | |
|---|---|---|
| 2015/0058549 A1 | 2/2015 | Jeffrey et al. |
| 2015/0063049 A1 | 3/2015 | Yang |
| 2015/0089326 A1 | 3/2015 | Joo et al. |
| 2015/0243338 A1 | 8/2015 | Sohn et al. |
| 2017/0011792 A1* | 1/2017 | Oh .................... G11C 11/40622 |

* cited by examiner

MEMORY DEVICE PERFORMING HAMMER REFRESH OPERATION AND MEMORY SYSTEM INCLUDING THE SAME

CROSS-REFERENCE TO RELATED APPLICATION

This U.S. non-provisional patent application claims the benefit of priority under 35 U.S.C. § 119 to Korean Patent Application No. 10-2016-0008442, filed on Jan. 25, 2016, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a memory device performing a hammer refresh operation and a memory system including the memory device.

2. Discussion of the Related Art

Semiconductor memory devices for storing data may be classified into volatile memory devices and non-volatile memory devices. Volatile memory devices, such as dynamic random access memory (DRAM) devices, may be configured to store data by charging or discharging capacitors in memory cells, and lose the stored data when power is off. Non-volatile memory devices, such as flash memory devices, may maintain stored data even when power is off. Volatile memory devices are widely used as main memories of various apparatuses, and non-volatile memory devices are widely used for storing program code and/or data in various electronic devices, such as computers, mobile devices, etc.

In volatile memory devices, cell charges stored in a memory cell may be lost by a leakage current. In addition, when a wordline is transitioned frequently between an active state and a precharged state (i.e., when the wordline has been accessed intensively or frequently), an affected memory cell connected to a wordline that is adjacent to the frequently accessed wordline may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost.

SUMMARY

Some example embodiments may provide a memory device capable of efficiently performing a hammer refresh operation associated with a hammer address that is accessed intensively.

According to some embodiments, the disclosure is directed to a memory device comprising: a memory bank including a plurality of memory blocks, each memory block including a plurality of memory cells arranged in rows and columns; a mapping circuit configured to receive a hammer address identifying a first wordline of the memory bank that has been intensively accessed and output a hammer refresh address identifying a second wordline of the memory bank that is physically adjacent to the first wordline; a row selection circuit configured to activate a third wordline of the memory bank as part of an access operation of memory cells connected to the third wordline and to concurrently perform a hammer refresh operation with respect to the second wordline; and a refresh controller configured to control the row selection circuit such that the hammer refresh operation is performed during a row active time of the access operation, According to further embodiments, the disclosure is directed to a memory system comprising: a memory device; and a memory controller configured to control the memory device, the memory device comprising: a memory bank including a plurality of memory blocks, each memory block including a plurality of memory cells arranged in rows and columns; a mapping circuit configured to receive a hammer address identifying a first wordline of the memory bank that has been intensively accessed and output a hammer refresh address identifying a second wordline of the memory bank that is physically adjacent to the first wordline; a row selection circuit configured to activate a third wordline of the memory bank as part of an access operation of memory cells connected to the third wordline and to concurrently perform a hammer refresh operation with respect to the second wordline; and a refresh controller configured to control the row selection circuit such that the hammer refresh operation is performed during a row active time of the access operation.

In further embodiments, the disclosure is directed to a memory device comprising: a memory bank including a plurality of memory blocks; a mapping circuit configured to receive a hammer address identifying a first wordline of the memory bank that has been intensively accessed and output a hammer refresh address identifying a second wordline of the memory bank that is physically adjacent to the first wordline; a row selection circuit configured to receive a row address identifying a third wordline of the memory bank, activate the third wordline as part of an access operation of memory cells connected to the third wordline, and concurrently perform a hammer refresh operation with respect to the second wordline; and a refresh controller configured to control the row selection circuit such that the hammer refresh operation is performed during a row active time of the access operation, wherein the refresh controller is configured to determine when the first wordline of the memory bank has been intensively accessed.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
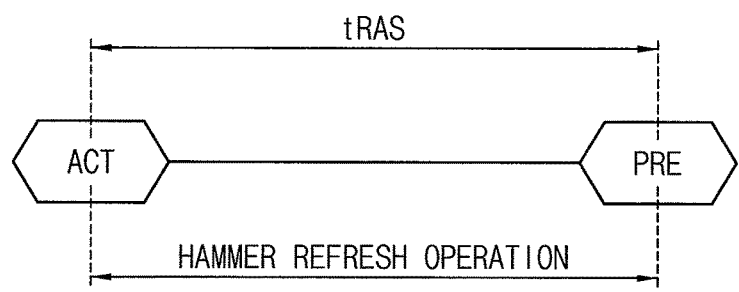
FIG. 1 is a diagram illustrating a timing of performing a hammer refresh operation according to example embodiments.

The present disclosure now will be described more fully hereinafter with reference to the accompanying drawings, in which various exemplary implementations are shown. The invention may, however, be embodied in many different forms and should not be construed as limited to the example exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, like numerals refer to like elements throughout. Repetitive descriptions may be omitted.

Unless the context indicates otherwise, the terms "first," "second," "third," etc. are only used to identify and distinguish one element, component, or section from another, for example as a naming convention. Thus, it may be possible that a first element, component, or section discussed below in one section of the specification may be referenced as a second element, component, or section in another section of the specification or in the claims.

FIG. 1 is a diagram illustrating a timing of performing a hammer refresh operation according to example embodiments.

Referring to FIG. 1, according to example embodiments, a hammer refresh operation may be performed during a row active time tRAS for an access operation. The row active time tRAS may correspond to a time interval from a transfer timing of an active command ACT to a transfer timing of a precharge command PRE. Although not illustrated in FIG. 1, other commands (e.g., a read command, a write command, etc.) may be transferred during the row active time tRAS. The device specifications or standards for various memory devices define the respective row active time tRAS and may specify a restriction that the precharge command PRE should be issued at least after the row active time tRAS from the time point when the active command ACT is issued.

The access operation may include activating a row or a wordline of the memory device corresponding to a row address signal for a read operation or a write operation. The hammer refresh operation may include activating a row or a wordline that is physically adjacent to a row that is accessed intensively or frequently. The access operations of the memory device are well-known to those skilled in the art and the detailed descriptions are omitted. The hammer refresh operation will be further described below with respect to FIG. 13.

Conventionally, the hammer refresh operation has been performed in synchronization with the refresh command that is transferred or issued from the memory controller. For example, a dynamic random access memory (DRAM) performs the refresh operation periodically due to charge leakage of memory cells storing data. Due to scale down of the manufacturing process of the DRAM, the storage capacitance of the memory cell is decreased and the refresh period is shortened. The refresh period is further shortened because the entire refresh time is increased as the memory capacity of the DRAM is increased. In general, a host device such as the memory controller cannot access the DRAM while the DRAM is in the refresh operation because of collision between the refresh operation and the access operation, and the resulting penalties can become serious.

In case of 8 gigabyte (GB) DDR4 (double data rate 4) DRAM, an average refresh interval time tREFi is about 7.8 μs (microseconds) and the refresh cycle time tRFC is about 350 ns (nanoseconds). In other words, the memory controller is configured to issue the refresh command every 7.8 μs and the memory controller may access the DRAM after waiting 350 ns from issuance of the refresh command. As a result, the memory controller consumes 4.5% of its time (i.e., 350 ns/7.8 μs) for controlling refresh operations and such time loss degrades performance of the memory system. When hammer refresh operations are also performed in response to the refresh commands received from the memory controller, the average refresh interval time is further shortened and the time loss due to the refresh operation is further increased.

In some embodiments, the memory device and the memory system according to example embodiments may efficiently perform the hammer refresh operation associated with the hammer address that is accessed intensively, and enhance performances of the memory device and the memory system by performing the hammer refresh operation during the row active time tRAS for the access operation.

Figure 2:
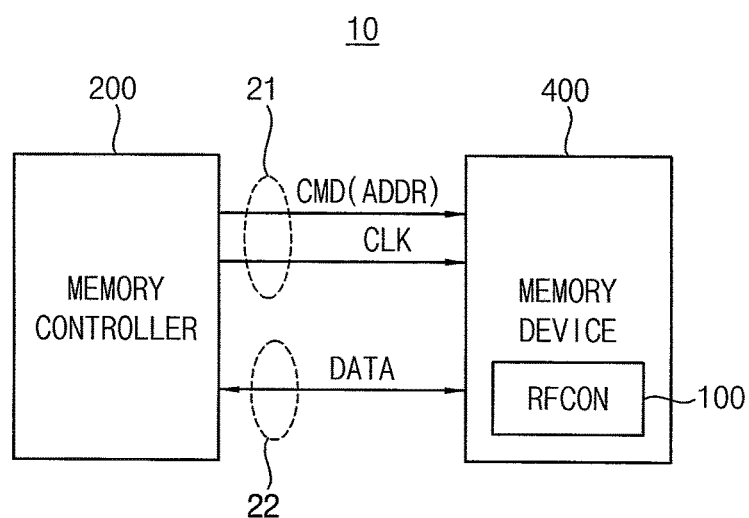
FIG. 2 is a block diagram illustrating a memory system according to example embodiments.
Figure 3:
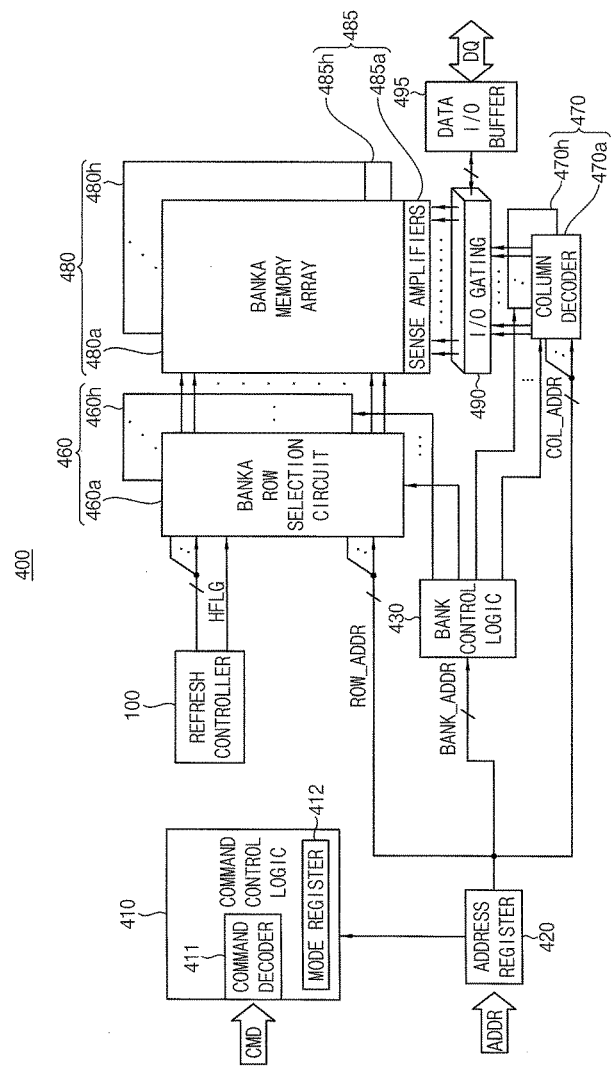
FIG. 3 is a block diagram illustrating an example embodiment of a memory device included in the memory system of FIG. 2.

FIG. 2 is a block diagram illustrating a memory system according to example embodiments, and FIG. 3 is a block diagram illustrating an example embodiment of a memory device included in the memory system of FIG. 2.

Referring to FIG. 2, a memory system 10 includes a memory controller 200 and a memory device 400. The memory controller 200 and the memory device 400 include respective interfaces for mutual communication. The interfaces may be connected through a control bus 21 for transferring a command CMD, an address ADDR, a clock signal CLK, etc. and a data bus 22 for transferring data. According to some standards for memory devices, the address ADDR may be incorporated in the command CMD (e.g., CMD(ADDR)). The memory controller 200 may generate the command CMD to control the memory device 400 and the data may be written in or read from the memory device 400 under the direction and control of the memory controller 200.

The memory device 400 may include a refresh controller 100 (labeled as RFCON), according to example embodiments. The refresh controller 100 may control the row selection circuit in the memory device 400 such that the hammer refresh operation may be performed during the row active time tRAS for the access operation. Thus the hammer refresh operation may be performed efficiently and the performance of the memory device 400 and the memory system 10 may be enhanced.

Referring to FIG. 3, the memory device 400 may include a command control logic 410, an address register 420, a bank control logic 430, a row selection circuit 460, a column decoder 470, a memory cell array 480, a sense amplifier unit 485, an input/output (I/O) gating circuit 490, a data input/output (I/O) buffer 495 and a refresh controller 100.

The memory cell array 480 may include a plurality of bank arrays 480a~480h. The row selection circuit 460 may include a plurality of bank row selection circuits 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive from the memory controller 200 an address ADDR including a bank address BANK_ADDR, a row address ROW_ADDR and a column address COL_ADDR. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. In response to the bank control signals generated by the bank control logic 430, one of the bank row selection circuits 460a~460h corresponding to the bank address BANK_ADDR may be activated, and one of the bank column decoders 470a~470h corresponding to the bank address BANK_ADDR may be activated. In some examples, multiple banks may be active and perform various access operation at the same time (e.g., in response to sequentially received commands associated with different bank addresses).

The row address ROW_ADDR provided by the address register 420 may be applied to the bank row selection circuits 460a~460h. One of the bank row selection circuits 460a~460h may be activated upon receipt of the row address ROW_ADDR. The activated one of the bank row selection circuits 460a~460h may decode the received row address ROW_ADDR, and may activate a word-line corresponding to the received row address ROW_ADDR. For example, the activated one of the bank row selection circuits 460a~460h may apply a word-line driving voltage to the word-line corresponding to the received row address ROW_ADDR.

The column decoder 470 may include a column address latch (not illustrated). The column address latch may receive the column address COL_ADDR from the address register 420, and may temporarily store the received column address COL_ADDR. In some embodiments, in a burst mode, the column address latch may generate column addresses that increment from the received column address COL_ADDR. The column address latch may apply the temporarily stored or generated column address to the bank column decoders 470a~470h. One of the bank column decoders 470a~470h may be activated upon receipt of the row address COL_ADDR.

The activated one of the bank column decoders 470a~470h may decode the received column address COL_ADDR and may control the input/output gating circuit 490 in order to output data corresponding to the received column address COL_ADDR.

The I/O gating circuit 490 may include circuitry for gating input/output data. Although not illustrated in FIG. 3, the I/O gating circuit 490 may further include read data latches for storing data that is output from the bank arrays 480a~480h, and write drivers for writing data to the bank arrays 480a~480h.

Data to be read from an identified bank array of the bank arrays 480a~480h may be sensed by a sense amplifier 485 coupled to the identified bank array of the bank arrays 480a~480h, and may be stored in the read data latches. The data stored in the read data latches may be provided to the memory controller 200 via the data I/O buffer 495. Data DQ to be written in one bank array of the bank arrays 480a~480h may be provided to the data I/O buffer 495 from the memory controller 200. The write driver may write the data DQ in one bank array of the bank arrays 480a~480h.

The command control logic 410 may control operations of the memory device 400. For example, the command control logic 410 may generate control signals for the memory device 400 in order to perform a write operation or a read operation. The command control logic 410 may include a command decoder 411 that decodes a command CMD received from the memory controller 200 and a mode register 412 that sets an operation mode of the memory device 400.

Although FIG. 3 illustrates the command control logic 410 and the address register 420 as distinct from each other, the command control logic 410 and the address register 420 may be implemented as a single integral circuit. In addition, although FIG. 3 illustrates the command CMD and the address ADDR are provided as individual signals, the command CMD and the address ADDR may be provided as a combined signals as specified by, for example, LPDDR5 standards, etc.

The refresh controller 100 may generate signals for controlling the refresh operation of the memory device 400. As described above, the refresh controller 100 may control the row selection circuit 460 such that the hammer refresh operation may be performed at a predetermined time, such as, for example, during the row access time tRAS.

As described below, the refresh controller 100 may generate a hammer flag signal HFLG representing a collision between the access operation and the hammer refresh operation based on a row address signal for the access operation and a hammer refresh address signal for the hammer refresh operation. For example, when the row address signal for the access operation and the hammer refresh address signal for the hammer refresh operation indicate the wordline in the same memory block or the wordlines in the adjacent memory blocks, the refresh controller 100 may determine that a collision condition exists and may generate a hammer flag signal HFLG. The row selection circuit 460 may perform the hammer refresh operation selectively in response to the hammer refresh flag signal HFLG FIG. 4 is a block diagram illustrating an example embodiment of a refresh controller 100 included in the memory device 400 of FIG. 3.

Figure 4:
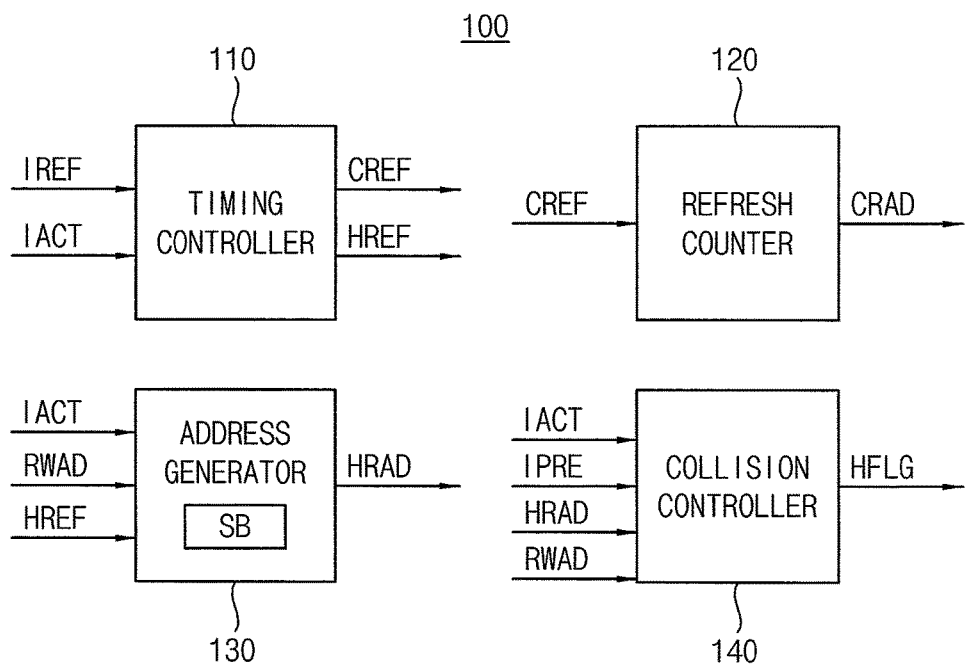
FIG. 4 is a block diagram illustrating an example embodiment of a refresh controller included in the memory device of FIG. 3.

Referring to FIG. 4, a refresh controller 100 may include may include a timing controller 110, a refresh counter 120, an address generator 130 and a collision controller 140.

The timing controller 110 may generate a counter refresh signal CREF in response to an internal refresh signal IREF representing a reception timing of a refresh command REF provided from an external device (e.g., a memory controller). In addition, the timing controller 110 may generate a hammer refresh signal HREF in response to an internal active signal representing a reception timing of an active command ACT from the external device.

The refresh counter 120 may generate a counter refresh address signal CRAD in synchronization with the counter refresh signal CREF such that the counter refresh address signal CRAD may represent a row address of the memory device 400 that changes sequentially. For example, the refresh counter 120 may increase a value of the counter refresh address signal CRAD whenever the counter refresh signal CREF is activated. Wordlines in the memory cell array may be selected sequentially for refresh operations by increasing the value of the counter refresh address signal CRAD. The example embodiment of this disclosure are for the hammer refresh operation and thus further descriptions of the normal refresh operation are omitted.

The address generator 130 may store information on the hammer address corresponding to the row that is accessed intensively. Based on the stored information, the address generator 130 may generate a hammer refresh address signal HRAD in synchronization with the hammer refresh signal HREF representing a timing of the hammer refresh operation. The hammer refresh address signal HRAD corresponds to the row that is physically adjacent to the row corresponding to the hammer address. Although this disclosure describes an embodiment where a hammer refresh operation is performed concurrently with an additional access operation in the same memory bank, the invention is not limited thereto. For example, the refresh operation need not be a hammer refresh operation and may be an additional refresh operation required by determining (e.g., by testing as part of manufacturing) certain rows of the memory device are weak cell rows (e.g., that are refreshed twice per refresh window rather than once per refresh window for normal cell rows) (see, e.g., U.S. patent application Ser. No. 14/858,140, filed Sep. 18, 2015, in the U.S. Patent and Trademark Office (USPTO), the entire content of which is incorporated herein by reference, regarding further detail of weak cell rows and related refresh operations). Alternatively, the refresh operation and the concurrently performed additional access operation described herein may both be refresh operations responsive to a refresh command (e.g., a burst refresh command) issued from an external memory controller. In such alternatives, the refresh address may not be a hammer refresh address signal HRAD but may be a refresh address corresponding to the weak cell row refresh operation or the refresh command as appropriate.

In some example embodiments, the address generator 130 may include a storage block SB that is configured to store row addresses and respective access count values corresponding to the row addresses as the information on the hammer address, and may do so based on (e.g., in response to) the internal active signal IACT representing the reception timing of the active command ACT from the memory controller 200 and a row address signal RWAD. Each of the access count values may indicate a number of occurrence of access to a respective row addresses. The address generator 130 will be further described below with reference to FIGS. 11 and 12.

The collision controller 140 may generate the hammer flag signal HFLG representing a collision between the access operation and the hammer refresh operation based on the row address signal RWAD for the access operation and the hammer refresh address signal HRAD for the hammer refresh operation.

Figure 5:
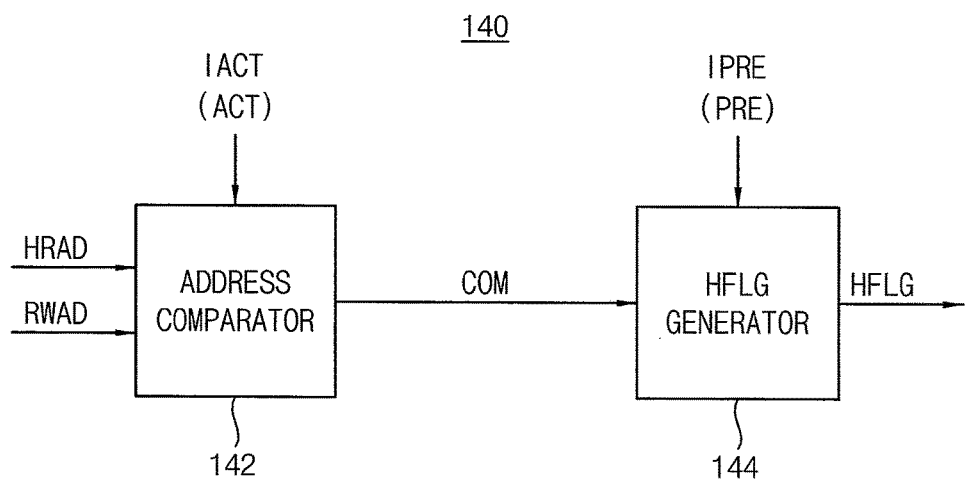
FIG. 5 is a block diagram illustrating an example embodiment of a collision controller included in the refresh controller of FIG. 4.

FIG. 5 is a block diagram illustrating an example embodiment of a collision controller 140 included in the refresh controller 100 of FIG. 4.

Referring to FIG. 5, a collision controller 140 may include an address comparator 142 and a hammer flag signal HFLG generator 144.

The command control logic 410 in FIG. 3 may generate the internal active signal IACT in response to the active command ACT received from the memory controller 200 such that the internal active signal IACT may represent the reception timing of the active command ACT. In addition, the command control logic 410 may generate an internal precharge signal IPRE in response to the precharge signal PRE received from the memory controller 200 such that the internal precharge signal IPRE may represent the reception timing of the precharge signal PRE. The internal active signal IACT may be an internal RAS (row address strobe) signal indicating start timing of row access for enabling a row or a wordline corresponding to the row address signal RWAD.

The address comparator 142 may generate a comparison signal COM based on the internal active signal IACT representing the reception timing of the active command ACT, the row address signal RWAD for the access operation, and the hammer refresh address signal HRAD for the hammer refresh operation. As will be described below with reference to FIG. 7, the address comparator 142 may activate the comparison signal COM when the memory block corresponding to the row address signal RWAD shares a write-read circuit (such as, for example, a sense amplifier) with the memory block corresponding to the hammer refresh address signal HRAD. For example, the address comparator 142 may activate the comparison signal COM when a memory block including a row corresponding to the hammer refresh address signal HRAD for the hammer refresh operation is the same as or is adjacent to, a memory block including a row corresponding to the row address signal RWAD for the access operation.

The flag signal generator 144 may generate the hammer flag signal HFLG based on the comparison signal COM and the internal precharge signal IPRE representing the reception timing of the precharge command PRE. As will be described below with reference to FIG. 8, the flag signal generator 144 may determine an activation timing of the hammer flag signal HFLG in response to the comparison signal COM and determine a deactivation timing of the hammer flag signal HFLG in response to the internal precharge signal IPRE.

Figure 6:
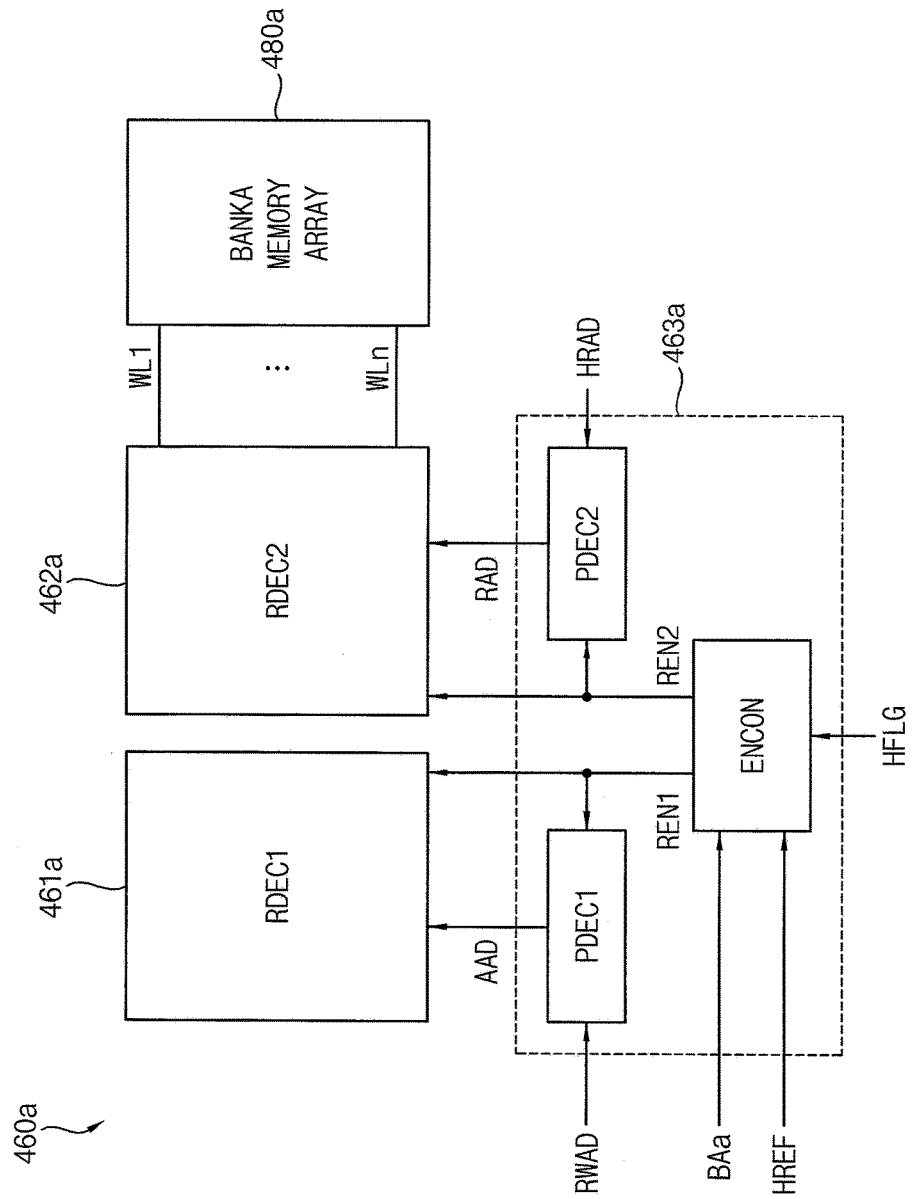
FIG. 6 is a block diagram illustrating an example embodiment of a row selection circuit included in the memory device of FIG. 3.

FIG. 6 is a block diagram illustrating an example embodiment of row selection circuit 460a included in the memory device 400 of FIG. 3. Even though the configuration and the operation of the first bank row selection circuit 460a are described with reference to FIG. 6, it will be appreciated that the other bank row selection circuits 460b~460h in FIG. 3 may have the same configuration and operation can be understood similarly. FIG. 6 also illustrates the bank memory array 480a.

Referring to FIG. 6, the bank row selection circuit 460a may include a first row decoder RDEC1 461a, a second row decoder RDEC2 462a and a decoder control block 463a.

The first row decoder RDEC1 461a may select, among the wordlines WL1~WLn, one wordline corresponding to an access address signal AAD in response to the access address signal AAD and a first row enable signal REN1. The second row decoder RDEC2 462a may select, among the wordlines WL1~WLn, one wordline WL corresponding to a refresh address signal RAD in response to the refresh address signal RAD and a second row enable signal REN2. Connection of the second row decoder RDEC2 462*a* to wordlines WL1~WLn is not shown in FIG. 6 for clarity of FIG. 6. Both row decoders RDEC1 461*a* and RDEC2 462*a* may comprise conventional decoding circuitry to decode the received address (refresh address signal RAD or access address signal AAD) to selectively activate one of the wordlines WL1~WLn corresponding to the received address. Activation of the selected wordline may comprise driving the selected wordline with a voltage so access transistors of memory cells connected to the selected wordline are turned on, to allow sense amplifier circuits (e.g., SAC1~SACn in FIG. 7) connected to bit lines connected to these memory cells to sense data of these memory cells.

The decoder control block 463*a* may include an enable controller ENCON, a first predecoder PDEC1 and a second predecoder PDEC2.

The enable controller ENCON may generate the first row enable signal REN1 and the second row enable signal REN2 based on a bank control signal BAa, a hammer refresh signal HREF and a hammer flag signal HFLG. The first predecoder PDEC1 may generate the access address signal AAD based on a row address signal RWAD and the first row enable signal REN1. The second predecoder PDEC2 may generate the refresh address signal RAD based on a hammer refresh address signal HRAD and the second row enable signal REN2.

The enable controller ENCON may generate the first row enable signal REN1 and the second row enable signal REN2 such that the first row enable signal REN1 may represent an enable timing of a wordline corresponding to the row address signal RWAD and the second row enable signal REN2 may represent an enable timing of a wordline corresponding to the hammer refresh address signal HRAD.

The enable controller ENCON may activate the first row enable signal REN1 in response to activation of the bank control signal BAa. The first row decoder RDEC1 461*a* may select and activate the wordline corresponding to the access address signal AAD, that is, the row address signal RWAD in response to the activated first row enable signal REN1. The first row decoder RDEC1 may be configured not to select and activate the word line corresponding to the access address signal ADD in response to the first row enable signal REN1 having a deactivated state.

In addition, the enable controller ENCON may selectively activate the second row enable signal REN2 in response to activation of the hammer refresh signal HREF. The enable controller ENCON may activate the second row enable signal REN2 when the hammer flag signal HFLG has a deactivated state and may deactivate the second row enable signal REN2 (to prevent a corresponding wordline selection by the second row decoder 462*a* in response to refresh address signal RAD) when the hammer flag signal HFLG has an activated state. The second row decoder RDEC2 462*a* may select and enable the wordline corresponding to the refresh address signal RAD (i.e., the hammer refresh address signal HRAD) in response to the activated second row enable signal REN2.

In some example embodiments, the first predecoder PDEC1 and the second predecoder PDEC2 may be omitted. In this case, the access address signal AAD may correspond to the row address signal RWAD and the refresh address signal RAD may correspond to the hammer refresh address signal HRAD.

Although the first row decoder RDEC1 461*a* and the second row decoder RDEC2 462*a* are separate in FIG. 6, the first and second row decoders RDEC1 461*a* and RDEC2 462*b* may be integrated into a single row decoder in other example embodiments, as will be described with reference to FIG. 9. In some embodiments, the single row decoder may adopt time-division multiplexing to receive the access address signal ADD in advance and then subsequently receive the refresh address signal RAD.

Figure 7:
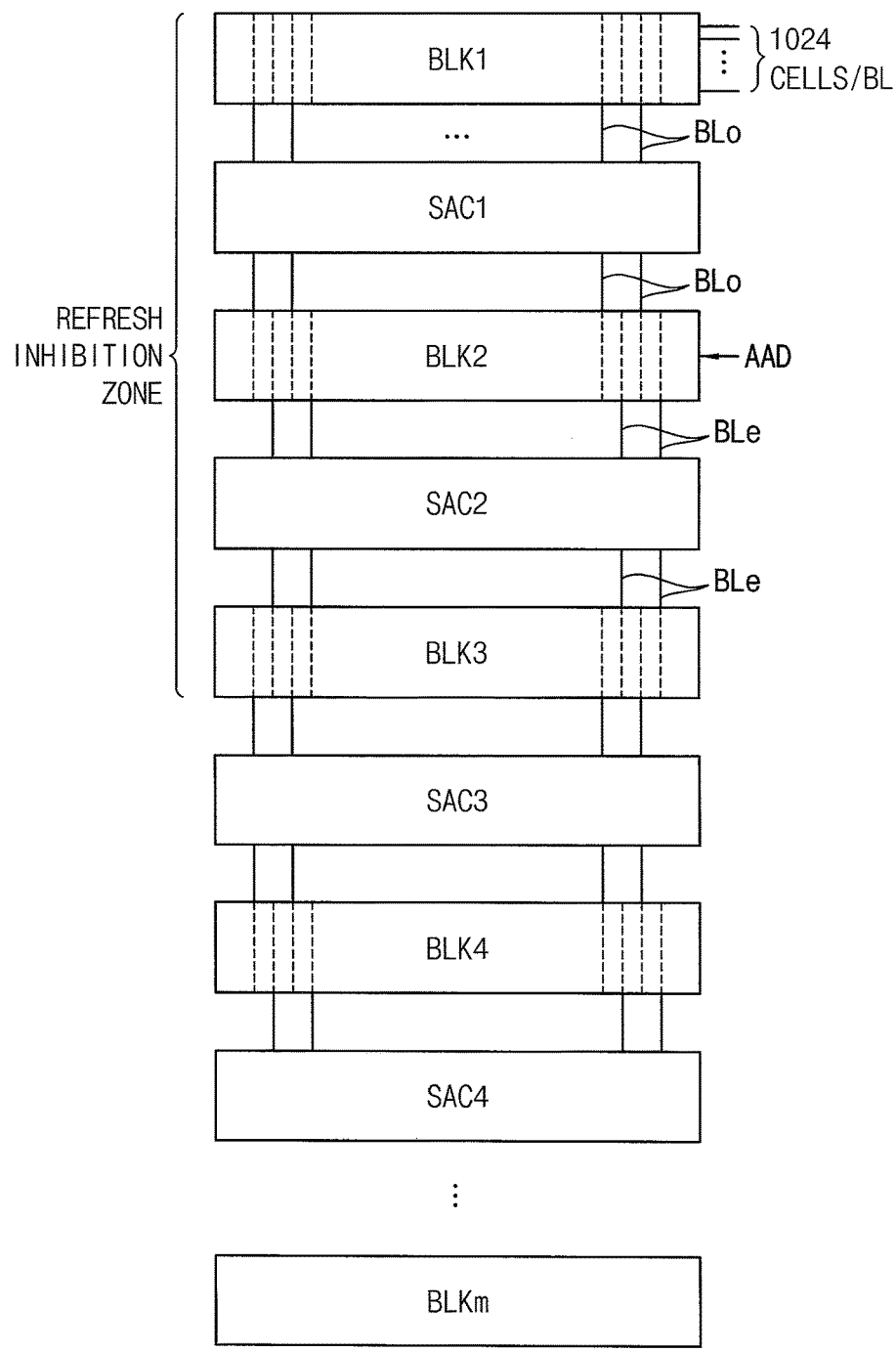
FIG. 7 is a block diagram illustrating an example embodiment of a memory bank included in the memory device of FIG. 3.

FIG. 7 is a block diagram illustrating an example embodiment of a memory bank included in the memory device 400 of FIG. 3.

Referring to FIG. 7, a memory bank 480*a* may include a plurality of memory blocks BLK1~BLKm. The sense amplifier unit 485 in FIG. 3 may include a plurality of sense amplifier circuits SAC1~SACn (here, SAC1~SAC4 are illustrated) that are distributed in the memory bank 480*a*. Each of the sense amplifier circuits SAC1~SACn may comprise a plurality of sense amplifiers connected via bit lines BL to the memory cells of the wordlines of some of the memory blocks BLK1~BLKm. Each sense amplifier may sense, amplify and latch data of memory cells to which they are connected. All sense amplifiers circuits SAC1~SACn of memory bank 480*a* may share I/O gating 490 and a column decoder 470*a* controlling such I/O gating 490. Column select lines (not shown) may extend across the memory bank 480*a*, each column select line connecting to all of the sense amplifier circuits SAC1~SACn of the memory bank 480*a*. Local I/O lines (not shown) may extend across the memory bank 480*a*, with each local I/O line connected to receive latched data from (or provide data to) each of the sense amplifier circuits SAC1~SACn of memory bank 480*a* in response to activation of a corresponding column select line by the column decoder 470*a*. Such local I/O lines, column select lines and column decoder 470*a*, while shared by the sense amplifier circuits SAC1~SACn of the memory bank 480*a*, may not be shared with other memory banks and may be dedicated to memory bank 480*a*. Each of the memory blocks BLK1~BLKm may include a predetermined number of wordlines WL. For example, each of the memory blocks BLK1~BLKm may include 1024 memory cells per bitline. The number of sense amplifier circuits SAC1~SACn may be related to the number of memory blocks (e.g., when memory bank 480*a* includes m number of memory blocks BLK1~BLKm, memory bank 480*a* may include m−1 sense amplifier circuits SAC1~SACm−1.)

As illustrated in FIG. 7, each of the sense amplifier circuits SAC1~SAC4 may be connected to the two adjacent memory blocks disposed at the top and bottom sides. For example, each of the sense amplifier circuits SAC1~SAC4 may be connected to only the odd-numbered bitlines of the top-side memory block and bottom-side memory block or only the even-numbered bitlines of the top-side memory block and the bottom-side memory block. A memory block may comprise all of the wordlines that are located between two adjacent sense amplifier circuits and the memory cells connected to those wordlines (e.g., memory block BLK3 may comprise all wordlines located between sense amplifier circuit SAC2 and SAC3). Other memory blocks on the periphery of the bank 480*a* may comprise all wordlines located between an outermost one of the sense amplifier circuits (e.g., SAC1) and the outer boundary of the memory bank 480*a* and the memory cells connected to those wordlines.

In this structure, if a wordline in a first memory block is selected and enabled for the access operation, during this access operation all other wordlines in the first memory block and the two adjacent memory blocks are prevented from being separately selected and enabled for a refresh operation. Thus, an additional simultaneous refresh operation is prevented for any wordline that shares a sense amplifier circuit with the wordline being accessed. For example, when the wordline corresponding to the access address signal AAD in the second memory block BLK2 is selected for the access operation, the other wordlines in the first, second and third memory blocks BLK1, BLK2 and BLK3 cannot be selected simultaneously for a separate refresh operation. As such, the wordlines or the rows, which cannot be selected for the refresh operation simultaneously or concurrently with the access operation, may be referred to as a refresh inhibition zone.

The collision controller 140 in FIG. 5 may compare the row address signal RWAD and the hammer refresh address signal HRAD, and may activate the hammer flag signal HFLG if the hammer refresh address signal HRAD is included in the refresh inhibition zone. In other words, if the memory bank has a structure as illustrated in FIG. 7, the collision controller 140 may activate the hammer flag signal HFLG when the memory block corresponding to the hammer refresh address signal HRAD is equal to or adjacent to the memory block corresponding to the row address signal RWAD.

Figure 8:
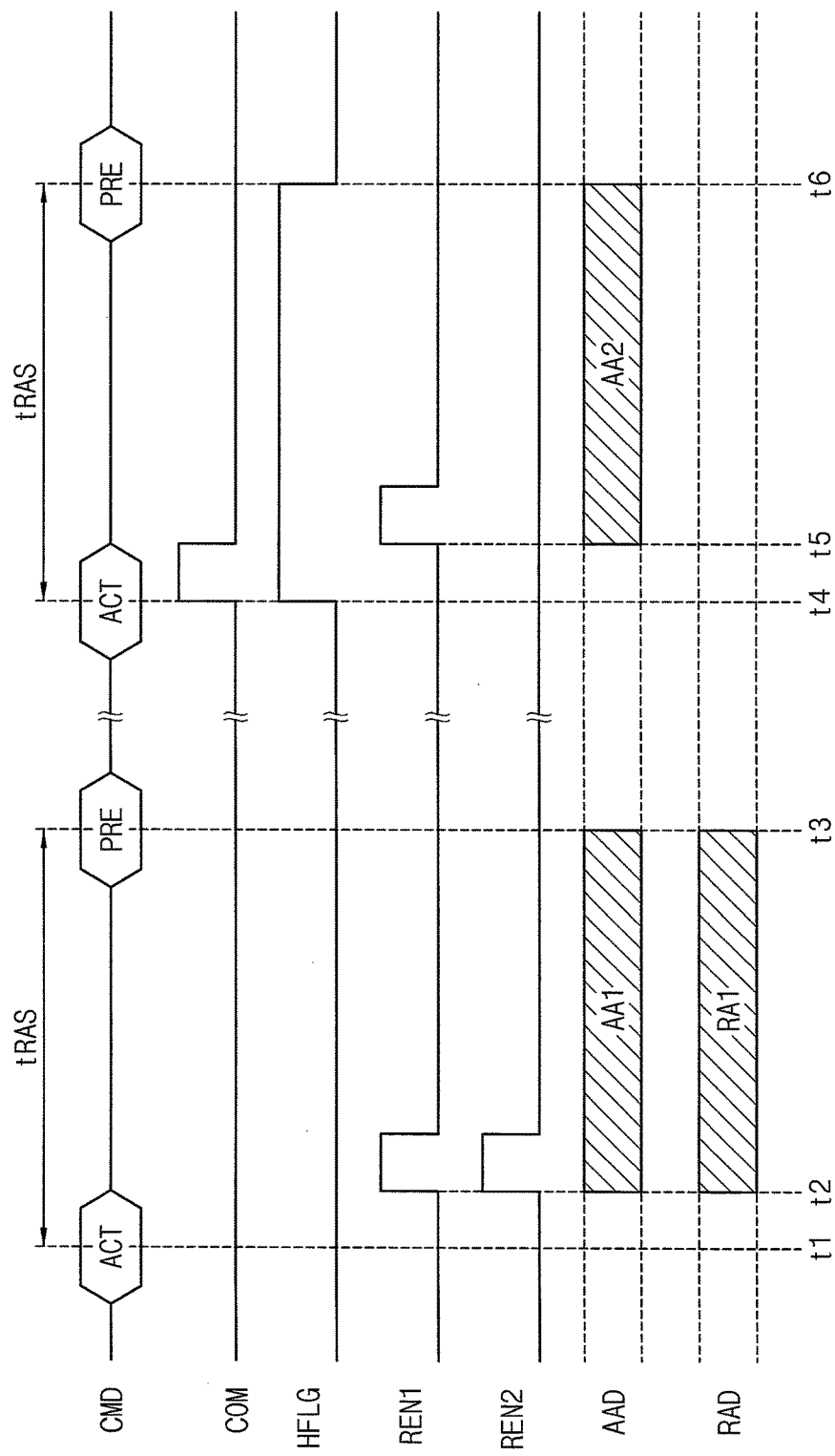
FIG. 8 is a timing diagram illustrating an operation of a memory system including the row selection of FIG. 6.

As such, the bank row selection circuit 460a may enable a row corresponding to the access address signal RAD (i.e., that row address signal RWAD in the access memory block among the plurality of memory blocks BLK1~BLKm) and may selectively enable or disable a row corresponding to the refresh address signal AAD (i.e., the hammer refresh address signal HRAD in the refresh memory block among the plurality of memory blocks BLK1~BLKm) in response to the hammer flag signal HFLG FIG. 8 is a timing diagram illustrating an operation of a memory system including the row selection of FIG. 6.

Referring to FIGS. 1 through 8, at time point t1, which corresponds to the start of a first row active time tRAS, the memory device 400 receives an active command ACT from the memory controller 200. The timing controller 110 in the refresh controller 100 may activate the hammer refresh signal HREF, which represents the timing of the hammer refresh operation, in response to the internal active signal IACT, which represents the reception timing of the active command ACT. The collision controller 140 in the refresh controller 100 may determine absence of a collision between the access operation and the hammer refresh operation and may maintain the deactivated states of the comparison signal COM and the hammer flag signal HFLG.

At time point t2, the enable controller ENCON may activate the first row enable signal REN1 and the first row decoder RDEC1 461a may enable the wordline or the row AA1 corresponding to the access address signal AAD to start the access operation. In addition, the enable controller ENCON may activate the second row enable signal REN2 and the second row decoder RDEC2 462a may enable the wordline or the row RA1 corresponding to the refresh address signal AAD, that is, the hammer refresh address signal HRAD to start the access operation.

At time point t3, after the row active time tRAS from time point t1, the memory device 400 receives a precharge command PRE from the memory controller 200, and the access operation and the hammer refresh operation for the enabled rows AA1 and RA1 end.

As such, the access operation for the one row AA1 and the hammer refresh operation for the one row RA1 may be performed simultaneously or concurrently when there is no collision between the access operation and the hammer refresh operation.

At time point t4, which corresponds to the start of a second row active time tRAS, the memory device 400 receives another active command ACT from the memory controller 200. The timing controller 110 in the refresh controller 100 may activate the hammer refresh signal HREF, which represents the timing of the hammer refresh operation, in response to the internal active signal IACT, which represents the reception timing of the active command ACT. The collision controller 140 in the refresh controller 100 may determine presence of a collision between the access operation and the hammer refresh operation and may activate the comparison signal COM and the hammer flag signal HFLG.

At time point t5, the enable controller ENCON may activate the first row enable signal REN1 and the first row decoder RDEC1 461a may enable the wordline or the row AA2 corresponding to the access address signal AAD to start the access operation. The enable controller ENCON may maintain the deactivated state of the second row enable signal REN2 in response to the activated hammer flag signal HFLG. The second row decoder RDEC2 462a may not perform the hammer refresh operation.

At time point t6, after the row active time tRAS from time point t4, the memory device 400 receives the precharge command PRE from the memory controller 200 and the access operation for the enabled row AA2 ends.

As such, the access operation for the one row AA2 may be performed and the hammer refresh operation may be inhibited when there is a collision between the access operation and the hammer refresh operation.

Figure 9:
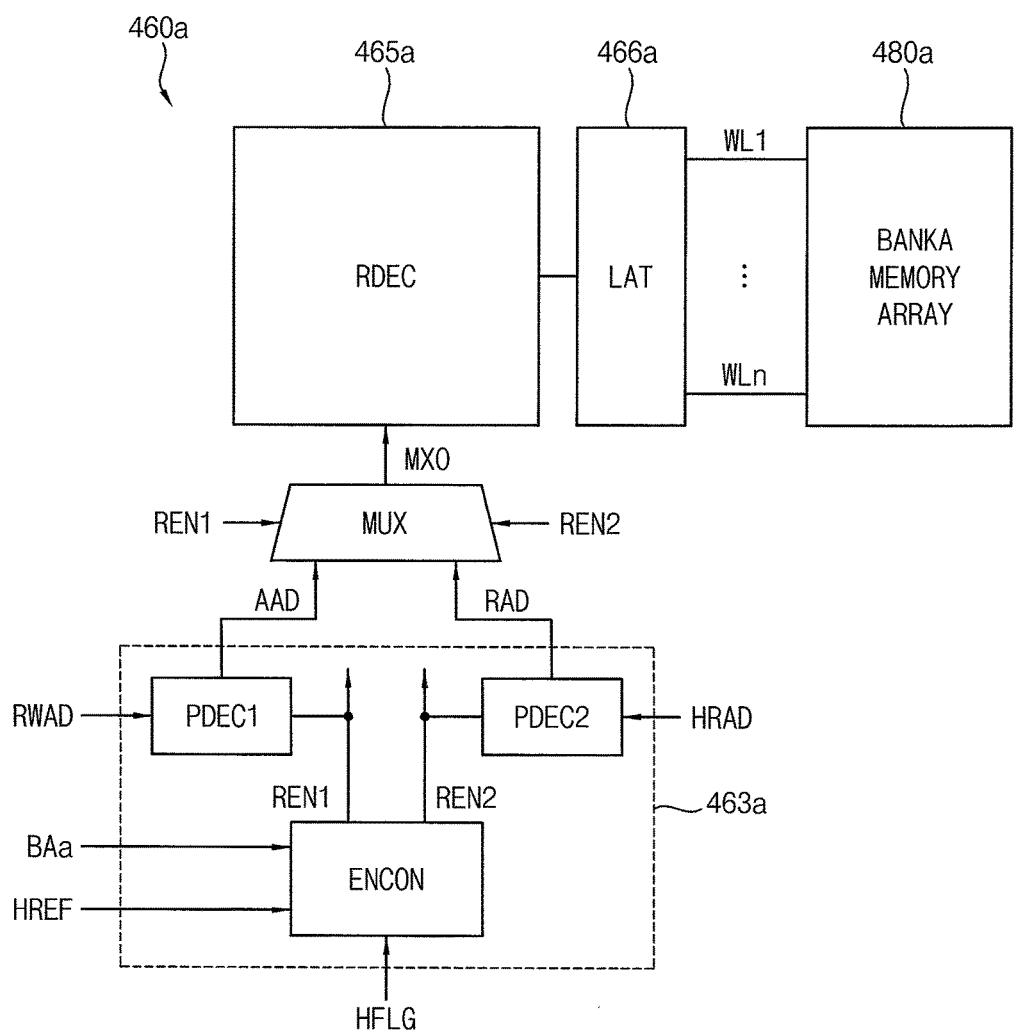
FIG. 9 is a block diagram illustrating an example embodiment of a row selection circuit included in the memory device of FIG. 3.

FIG. 9 is a block diagram illustrating an example embodiment of a row selection circuit included in the memory device 400 of FIG. 3. Even though the configuration and the operation of the first bank row selection circuit 460a are described with reference to FIG. 9, the other bank row selection circuits 460b~460h in FIG. 3 can be understood similarly. For convenience of description, the memory cell array or the bank array 480a is illustrated together in FIG. 9.

Referring to FIG. 9, the bank row selection circuit 460a may include a row decoder RDEC 465a, a latch circuit LAT 466a, a multiplexer MUX and a decoder control block 463a.

The row decoder RDEC 465a may sequentially decode and output the access address signal AAD and the refresh address signal RAD (i.e., the row address signal RWAD and the hammer refresh address signal HRAD) in response to the first row enable signal REN1 and the second row enable signal REN2. The latch circuit LAT 466a may sequentially enable a wordline corresponding to the row address signal RWAD and a wordline corresponding to the hammer refresh address signal HRAD in response to an output of the row decoder RDEC 465a. For example, in response to the output of the row decoder RDEC 465a, the latch circuit LAT 466a may enable a wordline corresponding to the row address signal RWAD, and then the latch circuit LAT 466a may enable a wordline corresponding to the hammer refresh address signal HRAD.

The multiplexer MUX may output the access address signal AAD or the refresh address signal RAD selectively in response to the first row enable signal REN1 and the second row enable signal REN2. The multiplexer MUX may provide the access address signal AAD as the output signal MXO when the first row enable signal REN1 is activated and may provide the refresh address signal RAD as the output signal MXO when the second row enable signal REN2 is activated. The multiplexer MUX may be included in the row decoder RDEC 465a or in the decoder control block 463a.

The decoder control block 463a may include an enable controller ENCON, a first predecoder PDEC1 and a second predecoder PDEC2.

The enable controller ENCON may generate the first row enable signal REN1 and/or the second row enable signal REN2 based on a bank control signal BAa, a hammer refresh signal HREF and a hammer flag signal HFLG. The first predecoder PDEC1 may generate the access address signal AAD based on the row address signal RWAD and the first row enable signal REN1. The second predecoder PDEC2a may generate the refresh address signal RAD based on the hammer refresh address signal HRAD and the second row enable signal REN2.

The enable controller ENCON may generate the first row enable signal REN1 and the second row enable signal REN2 such that the first row enable signal REN1 represents an enable timing of a wordline corresponding to the row address signal RWAD and the second row enable signal REN2 represents an enable timing of a wordline corresponding to the hammer refresh address signal HRAD. The first row enable signal REN1 and the second row enable signal REN2 may be activated sequentially when there is no collision between the access operation and the hammer refresh operation.

The enable controller ENCON may activate the first row enable signal REN1 in response to activation of the bank control signal BAa. The row decoder RDEC 465a may select and enable the wordline corresponding to the access address signal AAD (i.e., the row address signal RWAD) in response to the activated first row enable signal REN1.

In addition, the enable controller ENCON may selectively activate the second row enable signal REN2 in response to activation of the hammer refresh signal HREF. For example, the enable controller ENCON may activate the second row enable signal REN2 when the hammer flag signal HFLG is deactivated and may deactivate the second row enable signal REN2 when the hammer flag signal HFLG is activated. The row decoder RDEC 465a may select and enable the wordline corresponding to the refresh address signal RAD (i.e., the hammer refresh address signal HRAD) in response to the activated second row enable signal REN2.

As such, the first row decoder RDEC1 461a and the second row decoder RDEC2 462a may be integrated into the single row decoder RDEC 465a in FIG. 9. The row decoder RDEC 465a may adopt time-division multiplexing to receive the access address signal ADD in advance and then receive the refresh address signal RAD. For such time-division multiplexing, the first row enable signal REN1 and the second row enable signal REN2 may be activated sequentially.

Figure 10:
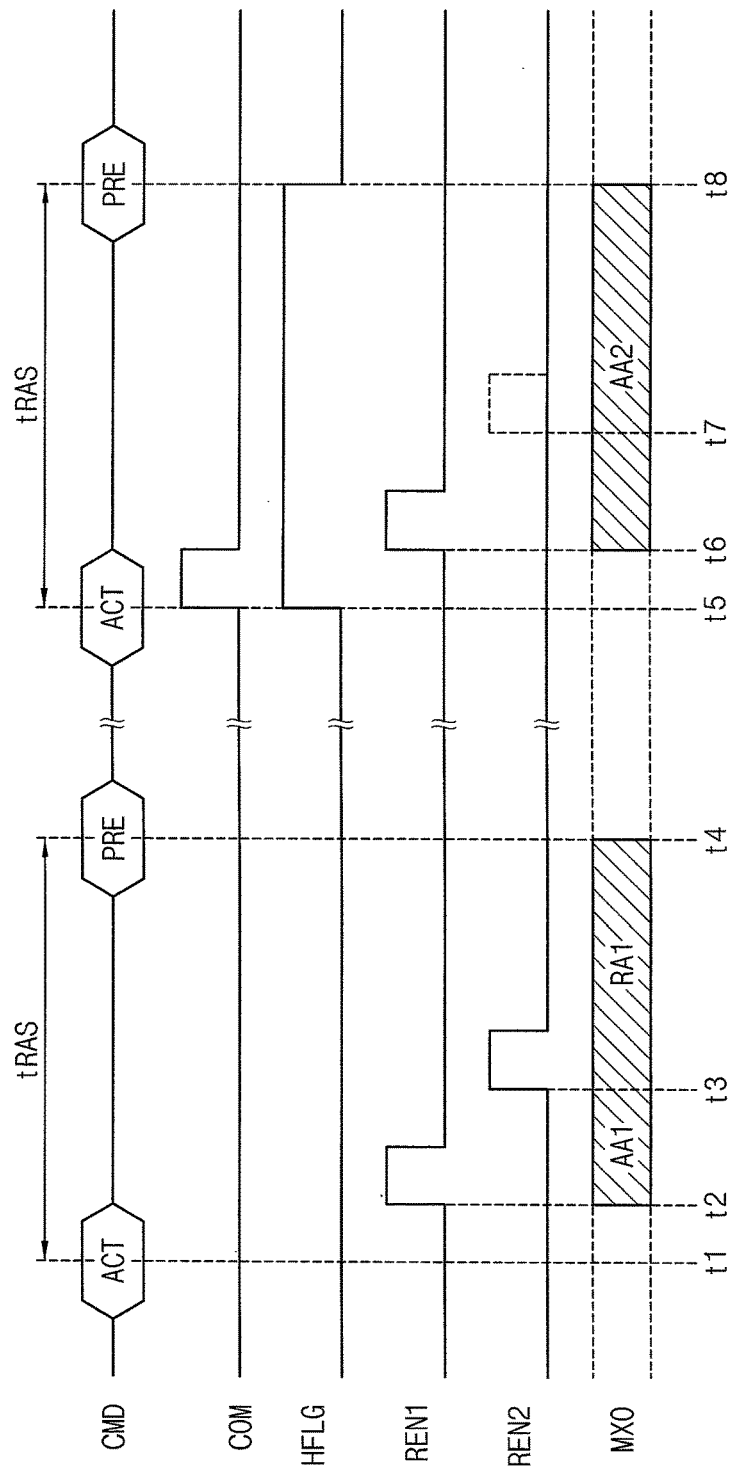
FIG. 10 is a timing diagram illustrating an operation of a memory system including the row selection of FIG. 9.

FIG. 10 is a timing diagram illustrating an operation of a memory system including the row selection of FIG. 9.

Referring to FIGS. 1 through 5, 7, 9 and 10, at time point t1, which corresponds to the start of a first row active time tRAS, the memory device 400 receives an active command ACT from the memory controller 200. The timing controller 110 in the refresh controller 100 may activate the hammer refresh signal HREF, which represents the timing of the hammer refresh operation, in response to the internal active signal IACT, which represents the reception timing of the active command ACT. The collision controller 140 in the refresh controller 100 may determine absence of a collision between the access operation and the hammer refresh operation and may maintain the deactivated states of the comparison signal COM and the hammer flag signal HFLG.

At time point t2, the enable controller ENCON may activate the first row enable signal REN1, the row decoder RDEC 465a may decode the access address signal AAD, and the latch circuit LAT 466a may enable the wordline or the row AA1 corresponding to the access address signal AAD to start the access operation.

At time point t3, the enable controller ENCON may activate the second row enable signal REN2, the row decoder RDEC 465a may decode the access address signal AAD, and the latch circuit LAT 466a may enable the wordline or the row RA1 corresponding to the refresh address signal AAD (i.e., the hammer refresh address signal HRAD) to start the access operation.

As such, the access operation and the hammer refresh operation may be performed sequentially by activating the first row enable signal REN1 and the second row enable signal REN2 sequentially.

At time point t4, after the row active time tRAS from time point t1, the memory device 400 receives a precharge command PRE from the memory controller 200, and the access operation and the hammer refresh operation for the enabled rows AA1 and RA1 end.

As such, the access operation for the one row AA1 and the hammer refresh operation for the one row RA1 may be performed simultaneously when there is no collision between the access operation and the hammer refresh operation.

At time point t5, the memory device 400 receives another active command ACT from the memory controller 200. The timing controller 110 in the refresh controller 100 may activate the hammer refresh signal HREF, which represents the timing of the hammer refresh operation, in response to the internal active signal IACT, which represents the reception timing of the active command ACT. The collision controller 140 in the refresh controller 100 may determine presence of a collision between the access operation and the hammer refresh operation and may activate the comparison signal COM and the hammer flag signal HFLG.

At time point t6, the enable controller ENCON may activate the first row enable signal REN1, the row decoder RDEC 465a may decode the access address signal AAD, and the latch circuit LAT 466a may enable the wordline or the row AA2 corresponding to the access address signal AAD to start the access operation.

At time point t7, the enable controller ENCON may maintain the deactivated state of the second row enable signal REN2 in response to the activated hammer flag signal HFLG. Accordingly, the refresh address signal RAD is not provided to the row decoder RDEC 465a and thus the hammer refresh operation may not be performed.

At time point t8, after the row active time tRAS from time point t5, the memory device 400 receives the precharge command PRE from the memory controller 200 and the access operation for the enabled row AA2 ends.

As such, the access operation for the one row AA2 may be performed and the hammer refresh operation may be inhibited when there is a collision between the access operation and the hammer refresh operation.

Figure 11:
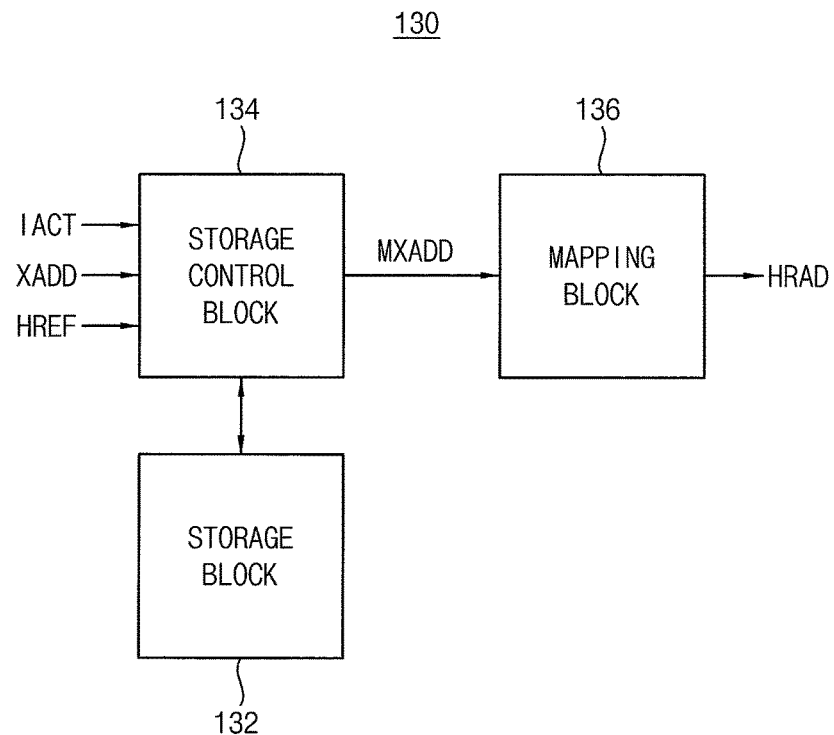
FIG. 11 is a block diagram illustrating an example embodiment of an address generator included in the refresh controller of FIG. 4.
Figure 12:
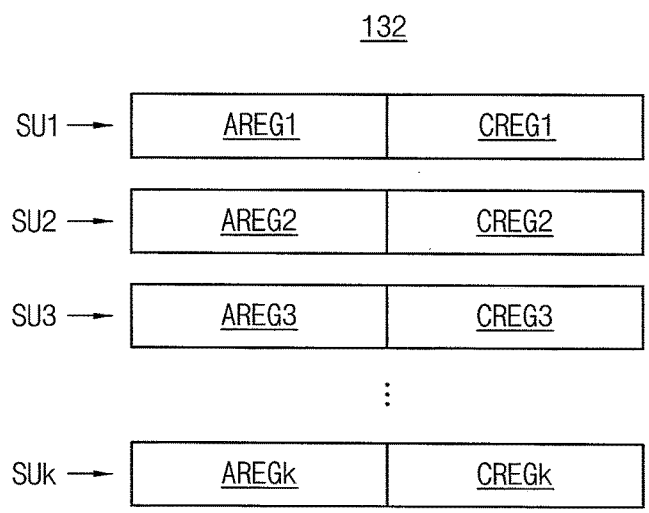
FIG. 12 is a diagram illustrating an example embodiment of a storage block included in the address generator of FIG. 11.

FIG. 11 is a block diagram illustrating an example embodiment of an address generator 130 included in the refresh controller 100 of FIG. 4, and FIG. 12 is a diagram illustrating an example embodiment of a storage block included in the address generator 130 of FIG. 11.

Referring to FIG. 11, an address generator 130 may include a storage block 132, a storage control block 134 and a mapping block (or a mapping circuit) 136.

The storage block 132 may store the information with respect to the hammer address MXADD that is accessed intensively or frequently. In some example embodiments, the storage block 132 may include a plurality of storage units SU1~SUk, as illustrated in FIG. 12. The storage units SU1~SUk may include address registers AREG1~AREGk storing the row addresses that are accessed and count registers CREG1~CREGk storing access count values corresponding to the row addresses. The count registers may be part of a counter (e.g., formed by connected flip-flops of a counter). Each of the storage units SU1~SUk may include a corresponding one of address registers AREG1~AREGk and one of count registers CREG1~CREGk. A count value stored in a first count register (one of the count registers CREG1~CREGk) may be incremented each time an access operation is performed on a row identified by the row address stored in the address register (one of AREG1~AREGk) corresponding to the first count register (one of CREG1~CREGk). Alternatively, a count value stored in each of the count registers CREG1~CREGk may represent a total access time of the row identified by the row address stored in the corresponding address register AREG1~AREGk. Each access to a row identified by a row address stored in an address register AREG1~AREGk may cause a corresponding increase in the count value stored in the corresponding count register CREG1~CREGk. In some embodiments, the hammer address MXADD may be determined to be accessed intensively or frequently when the count value stored in one of the count registers CREG1~CREGk exceeds a certain threshold value, when one access count value is greater than other access count values stored in the count registers CREG1~CREGk by a predetermined ratio, etc. See, e.g., U.S. patent application Ser. No. 14/514,416, filed Oct. 15, 2014, in the USPTO (incorporated by reference herein in its entirety), for further exemplary detail regarding circuitry and methods to determine a hammer address MXADD.

The storage control block 134 may control the storage block 132 based on (e.g., in response to) the hammer refresh signal HREF, the active signal IACT and the address signal XADD provided from the memory controller 200. Also the storage control block 134 may provide the hammer address MXADD based on the information stored in the storage block 132.

The mapping block 136 may generate the hammer refresh address signal HRAD based on the hammer address MXADD. As will be described below with reference to FIG. 13, the hammer refresh address signal HRAD may correspond to an address of a row that is physically adjacent to (e.g., physically directly adjacent to) the row corresponding to the hammer address MXADD. In some example embodiments, in response to activation of the hammer refresh signal HREF, the mapping block 136 may provide an address of one row of two adjacent rows. In some example embodiments, the mapping block 136 may sequentially provide addresses corresponding to two adjacent rows (e.g., two directly adjacent rows) in response to activation of the hammer refresh signal HREF.

Figure 13:
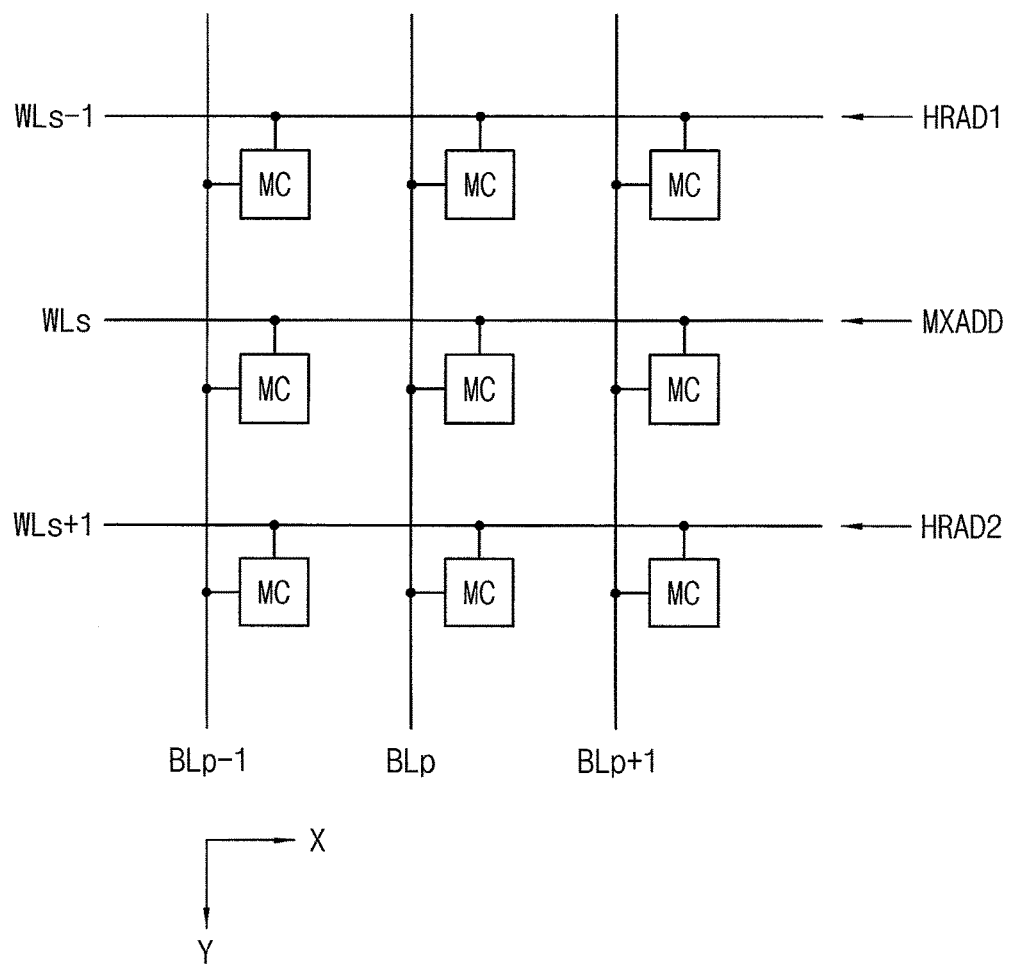
FIG. 13 is a diagram illustrating a portion of a memory cell array for describing a data loss due to wordline coupling.

FIG. 13 is a diagram illustrating a portion of a memory cell array for describing a data loss due to wordline coupling.

FIG. 13 illustrates three wordlines WLs−1, WLs and WLs+1, three bitlines BLp−1, BLp and BLp+1, and memory cells MC coupled to the wordlines WLs−1, WLs and WLs+1 and the bitlines BLp−1, BLp and BLp+1 in the memory cell array. The three wordlines WLs−1, WLs and WLs+1 are extended in a row direction (e.g., an X direction) and arranged sequentially along a column direction (e.g., a Y direction). The three bitlines BLp−1, BLp and BLp+1 are extended in the column direction (e.g., the Y direction) and arranged sequentially along the row direction (e.g., the X direction). It will be understood that the wordlines WLs−1 and WLs are physically directly adjacent to each other since there are no intervening wordlines between the wordlines WLs−1 and WLs, and the wordlines WLs and WLs+1 are physically directly adjacent to each other since there are no intervening wordlines between the wordlines WLs and WLs+1.

For example, the middle wordline WLs may correspond to the hammer address MXADD that has been accessed intensively. It will be understood that "an intensively-accessed wordline" or "frequently-accessed wordline" may refer to a wordline that has a relatively higher activation number and/or has a relatively higher activation frequency. For example, the number of times that the middle wordline WLs has been activated may be greater than the number of times that other wordlines WLs−1 and WLs+1 have been activated and/or the middle wordline WLs has been activated at a frequency higher than that of other wordlines WLs−1 and WLs+1. In some embodiments, a limit value for a row to normally maintain the data when the row is frequently activated may be defined by a specification. The limit value may be a threshold value that, when exceeded, results in a row being identified as a frequently or intensively accessed row. For example, whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−1 and WLs+1 to fluctuate as the voltage level of the hammer wordline WLs varies, and thus the cell charges of the memory cells MC coupled to the adjacent wordlines WLs−1 and WLs+1 are affected. As the hammer wordline WLs is accessed more frequently, the cell charges of the memory cells MC coupled to the adjacent wordlines WLs−1 and WLs+1 may be lost more rapidly.

The address generator 130 of FIG. 11 may provide the hammer refresh address signal HRAD representing the addresses HRAD1 and HRAD2 of the rows (e.g., the wordlines WLs−1 and WLs+1) that are physically adjacent to the row of the hammer address MXADD (e.g., the middle wordline WLs), and an refresh operation for the adjacent wordlines WLs−1 and WLs+1 may be performed additionally based on (e.g., in response to) the hammer refresh address signal HRAD to reduce or possibly prevent the loss of data stored in the memory cells MC.

Figure 14:
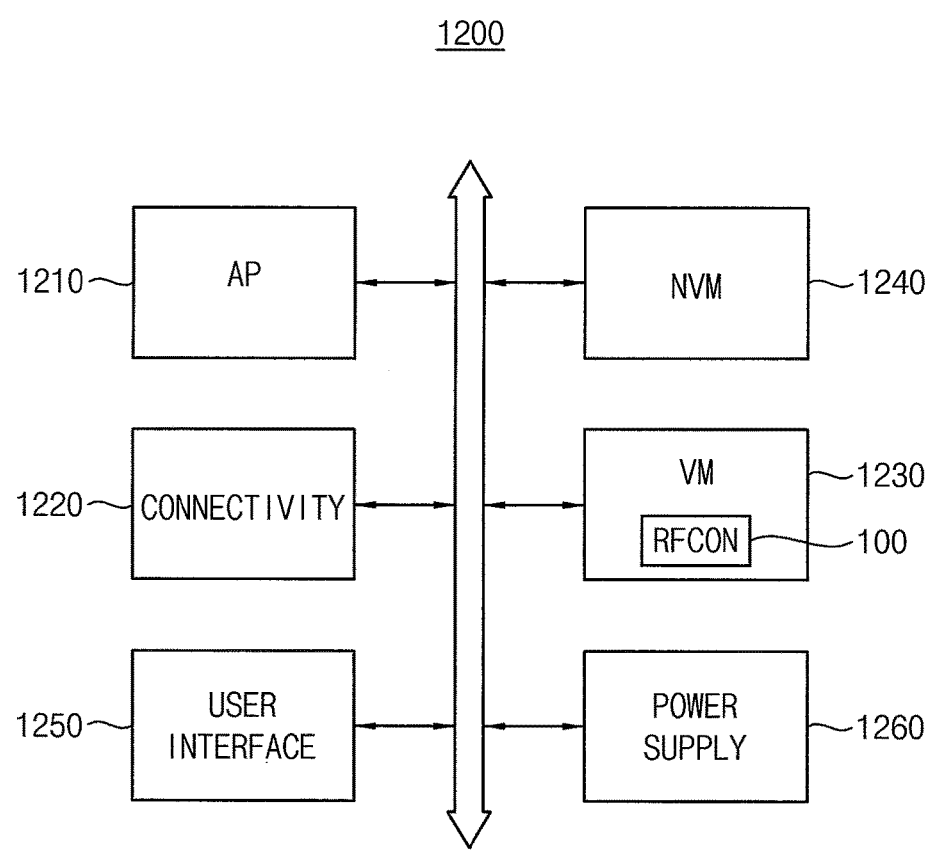
FIG. 14 is a block diagram illustrating a mobile system according to example embodiments.

FIG. 14 is a block diagram illustrating a mobile system according to example embodiments.

Referring to FIG. 14, a mobile system 1200 includes an application processor (AP) 1210, a connectivity unit 1220, a volatile memory device (VM) 1230, a nonvolatile memory device (NVM) 1240, a user interface 1250, and a power supply 1260.

The application processor 1210 may execute applications, such as, for example, a web browser, a game application, a video player, etc. The connectivity unit 1220 may perform wired or wireless communication with an external device (not shown). The volatile memory device 1230 may store data processed by the application processor 1210 or may operate as a working memory. The volatile memory device 1230 may include a refresh controller RFCON 100 according to example embodiments. As described above, the refresh controller 100 may include the address generator 130 and the collision controller 140. The address generator 130 may store information on the hammer address corresponding to the row that is accessed intensively and generate the hammer refresh address signal in synchronization with the hammer refresh signal representing the timing of the hammer refresh operation. The hammer refresh address signal may correspond to the row that is physically adjacent to the row corresponding to the hammer address. The collision controller 140 may generate the hammer flag signal representing a collision between the access operation and the hammer refresh operation based on a row address signal for the access operation and a hammer refresh address signal for the hammer refresh operation. Using the refresh controller 100, the hammer refresh operation may be performed efficiently during the row active time tRAS and the performance of the memory device and the system including the memory device may be enhanced.

The nonvolatile memory device 1240 may store a boot image for booting the mobile system 1200. The user interface 1250 may include at least one input device, such as, for example, a keypad, a touch screen, etc., and at least one output device, such as, for example, a speaker, a display device, etc. The power supply 1260 may supply a power supply voltage to the mobile system 1200.

As such, the refresh controller and the memory device adopting the refresh controller according to example embodiments may efficiently perform the hammer refresh operation associated with the hammer address that is accessed intensively and enhance performances of the memory device and the memory system by performing the hammer refresh operation during the row active time for the access operation.

The present concepts may be applied to any devices and systems including a memory device requiring a refresh operation. For example, the present concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present concept.

What is claimed is:

1. A memory device comprising:
a memory bank including a plurality of memory blocks, each memory block including a plurality of memory cells arranged in rows and columns;
a mapping circuit configured to receive a hammer address identifying a first wordline of the memory bank that has been intensively accessed and output a hammer refresh address identifying a second wordline of the memory bank that is physically adjacent to the first wordline;
a row selection circuit configured to activate a third wordline of the memory bank as part of an access operation of memory cells connected to the third wordline and to concurrently perform a hammer refresh operation with respect to the second wordline; and
a refresh controller configured to control the row selection circuit such that the hammer refresh operation is performed during a row active time of the access operation,
wherein the refresh controller is configured to generate a hammer flag signal, which represents a collision between the access operation associated with the third wordline and the hammer refresh operation associated with the second wordline, based on a row address of the access operation and the hammer refresh address of the hammer refresh operation.

2. The memory device of claim 1, wherein the row selection circuit is configured to selectively perform the hammer refresh operation in response to the hammer flag signal.

3. The memory device of claim 1, wherein the refresh controller is configured to activate the hammer flag signal when a first memory block including the second wordline corresponding to the hammer refresh address of the hammer refresh operation is equal to or adjacent to a second memory block including the third wordline corresponding to the row address of the access operation.

4. The memory device of claim 3, wherein the row selection circuit is configured to enable both the third wordline corresponding to the row address and the second wordline corresponding to the hammer refresh address when the hammer flag signal is deactivated, and
wherein the row selection circuit is configured to enable the third wordline corresponding to the row address and disable the second wordline corresponding to the hammer refresh address when the hammer flag signal is activated.

5. The memory device of claim 1, wherein the refresh controller includes:
an address generator configured to store information related to the hammer address corresponding to the first wordline that is accessed intensively and generate the hammer refresh address in synchronization with a hammer refresh signal representing a timing of the hammer refresh operation; and
a collision controller configured to generate a hammer flag signal representing a collision between the access operation and the hammer refresh operation based on a row address of the access operation and the hammer refresh address of the hammer refresh operation.

6. The memory device of claim 5, wherein the collision controller includes:
an address comparator configured to generate a comparison signal based on an internal active signal representing a reception timing of an active command, the row address and the hammer refresh address; and
a flag signal generator configured to generate the hammer flag signal based on the comparison signal and an internal precharge signal representing a reception timing of a precharge command.

7. The memory device of claim 6, wherein the collision controller is configured to determine an activation timing of the hammer flag signal in response to the active command and determine a deactivation timing of the hammer flag signal in response to the precharge command.

8. The memory device of claim 6, wherein the row selection circuit is configured to generate a first row enable signal representing an enable timing of the third wordline corresponding to the row address and a second row enable signal representing an enable timing of the second wordline corresponding to the hammer refresh address.

9. The memory device of claim 8, wherein the row selection circuit is configured to activate the first row enable signal and the second row enable signal when the hammer flag signal is deactivated, and wherein the row selection circuit is configured to activate the first row enable signal and deactivate the second row enable signal when the hammer flag signal is activated.

10. The memory device of claim 8, wherein the row selection circuit includes:

a first row decoder configured to enable the third wordline corresponding to the row address in response to the first row enable signal; and a second row decoder configured to enable the second wordline corresponding to the hammer refresh address in response to the second row enable signal.

11. The memory device of claim 8, wherein the row selection circuit incudes:

a row decoder configured to sequentially decode and output the row address and the hammer refresh address in response to the first row enable signal and the second row enable signal, respectively; and a latch circuit configured to sequentially enable the third wordline corresponding to the row address and the second wordline corresponding to the hammer refresh address in response to the row address and the hammer refresh address output by the row decoder.

12. The memory device of claim 5, wherein the refresh controller further incudes:

a timing controller configured to generate the hammer refresh signal in response to an internal active signal representing a reception timing of an active command.

13. A memory system comprising:

a memory device; and a memory controller configured to control the memory device, the memory device comprising:

a memory bank including a plurality of memory blocks, each memory block including a plurality of memory cells arranged in rows and columns;

a mapping circuit configured to receive a hammer address identifying a first wordline of the memory bank that has been intensively accessed and output a hammer refresh address identifying a second wordline of the memory bank that is physically adjacent to the first wordline;

a row selection circuit configured to activate a third wordline of the memory bank as part of an access operation of memory cells connected to the third wordline and to concurrently perform a hammer refresh operation with respect to the second wordline; and a refresh controller configured to control the row selection circuit such that the hammer refresh operation is performed during a row active time of the access operation, wherein the refresh controller is configured to generate a hammer flag signal, which represents a collision between the access operation associated with the third wordline and the hammer refresh operation, based on a row address of the access operation and a hammer refresh address of the hammer refresh operation.

14. A memory device comprising:

a memory bank including a plurality of memory blocks;

a mapping circuit configured to receive a hammer address identifying a first wordline of the memory bank that has been intensively accessed and output a hammer refresh address identifying a second wordline of the memory bank that is physically adjacent to the first wordline;

a row selection circuit configured to receive a row address identifying a third wordline of the memory bank, activate the third wordline as part of an access operation of memory cells connected to the third wordline, and concurrently perform a hammer refresh operation with respect to the second wordline; and a refresh controller configured to control the row selection circuit such that the hammer refresh operation is performed during a row active time of the access operation, wherein the refresh controller is configured to determine when the first wordline of the memory bank has been intensively accessed, wherein the refresh controller is configured to generate a hammer flag signal, which represents a collision between the access operation and the hammer refresh operation, based on the row address of the access operation and the hammer refresh address of the hammer refresh operation, and wherein the row selection circuit is configured to selectively perform the hammer refresh operation in response to the hammer flag signal.

15. The memory device of claim 14, wherein the refresh controller is configured to activate the hammer flag signal when a first memory block including the second wordline is equal to or adjacent to a second memory block including the third wordline.

16. The memory device of claim 14, wherein the refresh controller includes:

an address generator configured to store information related to the hammer address that corresponds to the first wordline that is accessed intensively and generate the hammer refresh address in synchronization with a hammer refresh signal representing a timing of the hammer refresh operation; and a collision controller configured to generate a hammer flag signal representing a collision between the access operation and the hammer refresh operation based on the row address and the hammer refresh address.

17. The memory device of claim 16, wherein the information stored in the address generator includes the hammer address and an access count value corresponding to the first wordline, and wherein the first wordline is determined to be accessed intensively based on the access count value.

* * * * *